(12) United States Patent
Lin et al.

(10) Patent No.: US 11,120,986 B2
(45) Date of Patent: Sep. 14, 2021

(54) ETCHING USING CHAMBER WITH TOP PLATE FORMED OF NON-OXYGEN CONTAINING MATERIAL

(71) Applicant: Taiwan Semiconductor Manufacturing Company, Ltd., Hsinchu (TW)

(72) Inventors: En-Ping Lin, Taoyuan (TW); Yi-Wei Chiu, Kaohsiung (TW); Tzu-Chan Weng, Kaohsiung (TW); Wen-Zhong Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/600,091

(22) Filed: Oct. 11, 2019

(65) Prior Publication Data

US 2020/0043720 A1    Feb. 6, 2020

Related U.S. Application Data

(63) Continuation of application No. 15/725,744, filed on Oct. 5, 2017, now Pat. No. 10,504,720.

(Continued)

(51) Int. Cl.
*H01L 21/02* (2006.01)
*H01L 21/302* (2006.01)
(Continued)

(52) U.S. Cl.
CPC ...... *H01L 21/02129* (2013.01); *C23C 16/401* (2013.01); *H01L 21/022* (2013.01); *H01L 21/02008* (2013.01); *H01L 21/02164* (2013.01); *H01L 21/02271* (2013.01); *H01L 21/02389* (2013.01); *H01L 21/302* (2013.01);
(Continued)

(58) Field of Classification Search
CPC ......... H01L 21/02129; H01L 21/76224; H01L 21/68757; H01L 21/31116; H01L 21/3081; H01L 21/6719; H01L 21/02164; H01L 21/02008; H01L 21/76243; H01L 21/302; H01L 21/02271; H01L 21/022;
(Continued)

(56) References Cited

U.S. PATENT DOCUMENTS 5,993,594 A   11/1999 Wicker et al.
6,022,446 A   2/2000 Shan et al.
(Continued)

FOREIGN PATENT DOCUMENTS

CN    1707761 A    12/2005
CN    101395702 A   3/2009
(Continued)

*Primary Examiner* — Duy Vu N Deo
*Assistant Examiner* — Mahmoud Dahimene
(74) *Attorney, Agent, or Firm* — Slater Matsil, LLP

(57) ABSTRACT

A method includes etching a first oxide layer in a wafer. The etching is performed in an etcher having a top plate overlapping the wafer, and the top plate is formed of a non-oxygen-containing material. The method further includes etching a nitride layer underlying the first oxide layer in the etcher until a top surface of a second oxide layer underlying the nitride layer is exposed. The wafer is then removed from the etcher, with the top surface of the second oxide layer exposed when the wafer is removed.

19 Claims, 13 Drawing Sheets

Related U.S. Application Data

(60) Provisional application No. 62/427,494, filed on Nov. 29, 2016.

(51) Int. Cl.
*H01L 21/762* (2006.01)
*C23C 16/40* (2006.01)
*H01L 21/687* (2006.01)
*H01L 21/311* (2006.01)
*H01L 21/308* (2006.01)
*H01L 21/67* (2006.01)

(52) U.S. Cl.
CPC .... *H01L 21/3081* (2013.01); *H01L 21/31116* (2013.01); *H01L 21/6719* (2013.01); *H01L 21/68757* (2013.01); *H01L 21/76224* (2013.01); *H01L 21/76243* (2013.01)

(58) Field of Classification Search
CPC ......... H01L 21/02389; H01L 21/31144; H01L 29/66795; C23C 16/401
See application file for complete search history.

(56) References Cited

U.S. PATENT DOCUMENTS

| | | | |
|---|---|---|---|
| 6,036,878 A * | 3/2000 | Collins | H01J 37/321 216/68 |
| 6,251,764 B1 * | 6/2001 | Pradeep | H01L 21/31116 438/595 |
| 6,277,752 B1 * | 8/2001 | Chen | H01L 21/3081 257/E21.232 |
| 8,237,928 B2 | 8/2012 | Monkowski et al. | |
| 8,298,626 B2 | 10/2012 | Fischer | |
| 8,946,038 B2 | 2/2015 | Hu et al. | |
| 2001/0020516 A1 * | 9/2001 | Khan | H01L 21/67069 156/345.24 |
| 2004/0163764 A1 | 8/2004 | Collins et al. | |
| 2007/0204797 A1 * | 9/2007 | Fischer | H01J 37/32642 118/723 R |
| 2010/0040768 A1 | 2/2010 | Dhindsa | |
| 2012/0222752 A1 | 9/2012 | Diaz et al. | |
| 2014/0252428 A1 | 9/2014 | Chang et al. | |
| 2014/0302683 A1 | 10/2014 | Kikuchi et al. | |
| 2015/0004796 A1 * | 1/2015 | Kim | H01L 21/31144 438/719 |
| 2016/0307771 A1 | 10/2016 | Xu et al. | |

FOREIGN PATENT DOCUMENTS

| | | | |
|---|---|---|---|
| KR | 20020087477 A | 11/2002 | |
| KR | 20130139158 A | 12/2013 | |
| TW | 200917330 A | 4/2009 | |
| WO | 0175189 A2 | 10/2001 | |
| WO | WO-0175189 A2 * | 10/2001 | ......... C23C 16/4407 |

* cited by examiner

ETCHING USING CHAMBER WITH TOP PLATE FORMED OF NON-OXYGEN CONTAINING MATERIAL

PRIORITY CLAIM AND CROSS-REFERENCE

This application is a continuation of U.S. patent application Ser. No. 15/725,744, entitled "Etching Using Chamber with Top Plate Formed of Non-Oxygen Containing Material," filed Oct. 5, 2017, which claims the benefit of the U.S. Provisional Application No. 62/427,494, filed Nov. 29, 2016, and entitled "Etching Using Chamber with Top Plate Formed of Non-Oxygen Containing Material," which applications are hereby incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFETs) were thus developed. The FinFETs include vertical semiconductor fins. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins.

In the formation of the STI regions, a pad oxide layer and a nitride hard mask may be used to define the patterns of the STI regions. The pad oxide layer and the nitride hard mask are first etched using a patterned mandrel structure as an etching mask, and then the semiconductor substrate is etched using the nitride hard mask as another etching mask to form trenches in the semiconductor substrate. Trenches are then filled with a dielectric material to form STI regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
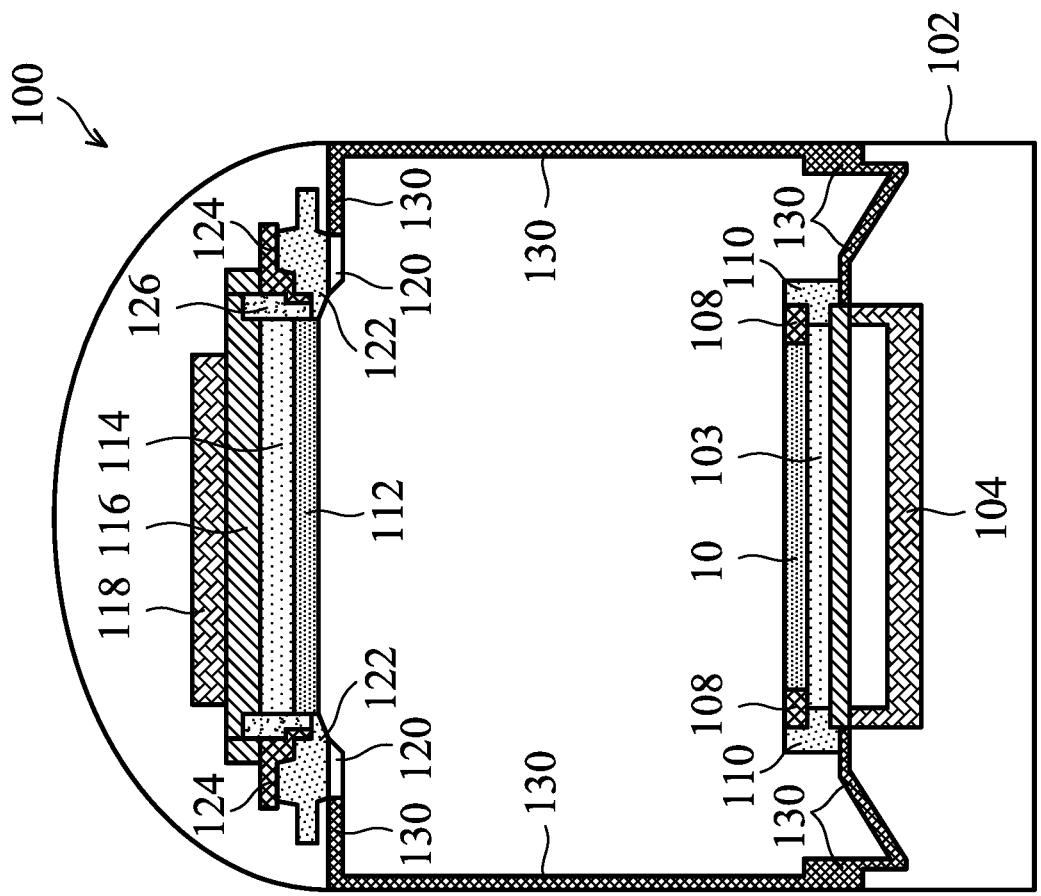
FIG. 1A illustrates a cross-sectional view of a part of a dry etcher in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The method of forming Shallow Trench Isolation (STI) regions, Fin Field-Effect Transistors (FinFETs), and the apparatus for performing the same are provided in accordance with various exemplary embodiments. The intermediate stages of forming the STI regions are illustrated in accordance with some embodiments. Some variations of some embodiments are discussed. Throughout the various views and illustrative embodiments, like reference numbers are used to designate like elements.

Figure 12:
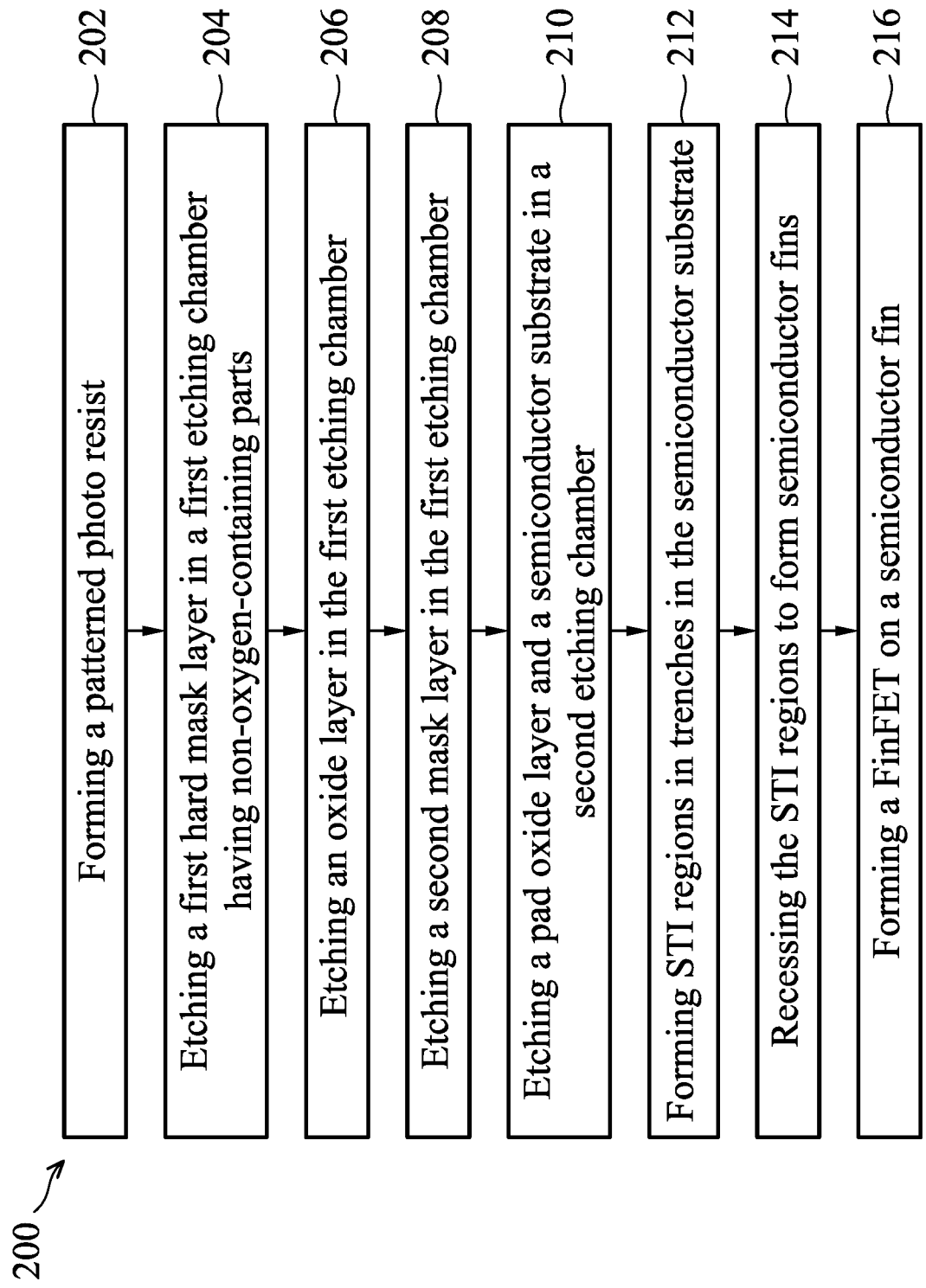
FIG. 12 illustrates a process flow for forming shallow trench isolation regions and the corresponding Fin Field-Effect Transistors (FinFETs) in accordance with some embodiments.

FIGS. 2 through 10 illustrate the cross-sectional views of intermediate stages in the formation of a Fin Field-Effect Transistor (FinFET) in accordance with some embodiments of the present disclosure. The steps shown in FIGS. 2 through 10 are also reflected schematically in the process flow 200 shown in FIG. 12.

Figure 2:
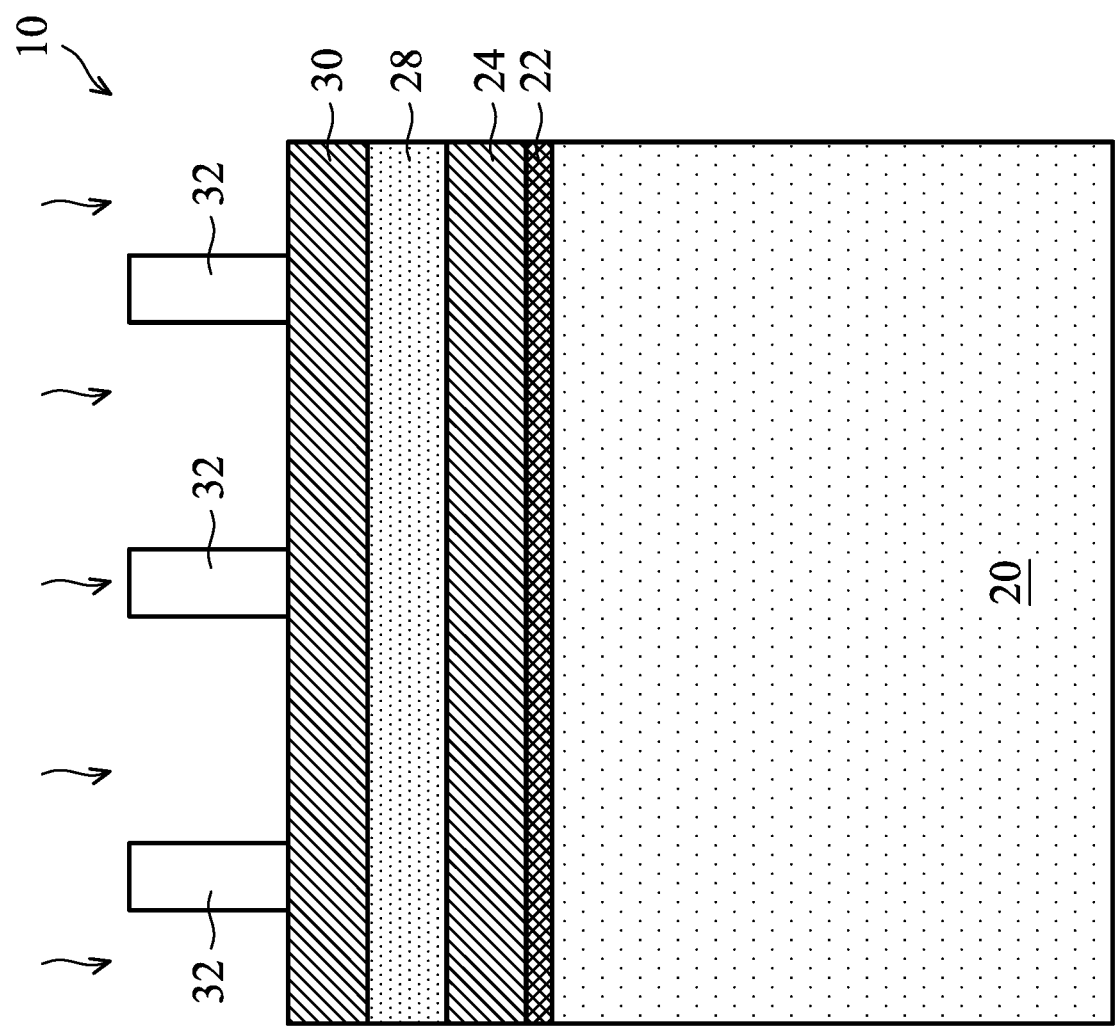
FIGS. 2 through 10 illustrate the cross-sectional views of intermediate stages in the formation of shallow trench isolation regions in accordance with some embodiments.

Referring to FIG. 2, semiconductor substrate 20, which is a part of semiconductor wafer 10, is provided. In accordance with some embodiments of the present disclosure, semiconductor substrate 20 includes crystalline silicon. Commonly used materials such as carbon, germanium, gallium, boron, arsenic, nitrogen, indium, and/or phosphorus may also be included in semiconductor substrate 20. Semiconductor substrate 20 may also be formed of other semiconductor materials such as III-V compound semiconductor materials. Semiconductor substrate 20 may be a bulk substrate or a Semiconductor-On-Insulator (SOI) substrate.

Pad layer 22 and hard mask layer 24 are formed on semiconductor substrate 20. Pad layer 22 may be a thin film formed of an oxide such as silicon oxide. Accordingly, layer 22 is referred to as a pad oxide layer hereinafter. In accordance with some embodiments of the present disclosure, pad oxide layer 22 is formed in a thermal oxidation process, wherein a top surface layer of semiconductor substrate 20 is oxidized. Pad oxide layer 22 acts as an adhesion layer between semiconductor substrate 20 and hard mask layer 24. Pad oxide layer 22 may also act as an etch stop layer for etching hard mask layer 24. In accordance with some embodiments of the present disclosure, hard mask layer 24 is formed of silicon nitride, for example, using Low-Pressure Chemical Vapor Deposition (LPCVD). In accordance with other embodiments of the present disclosure, hard mask layer 24 is formed by thermal nitridation of silicon, Plasma Enhanced Chemical Vapor Deposition (PECVD), or plasma anodic nitridation. Hard mask layer 24 is used as a hard mask during subsequent mandrel processes.

In accordance with some embodiments of the present disclosure, oxide layer 28 and hard mask layer 30 are formed over hard mask layer 24. In accordance with some embodiments, oxide layer 28 is formed of an oxide, which may be silicon oxide. Oxide layer 28 may be formed using, for example, PECVD or Chemical Vapor Deposition (CVD). Hard mask layer 30 may also be formed of silicon nitride in accordance with some embodiments. Hard mask layer 30 may be formed using a method selected from the same group of candidate methods for forming hard mask layer 24.

Figure 1B:
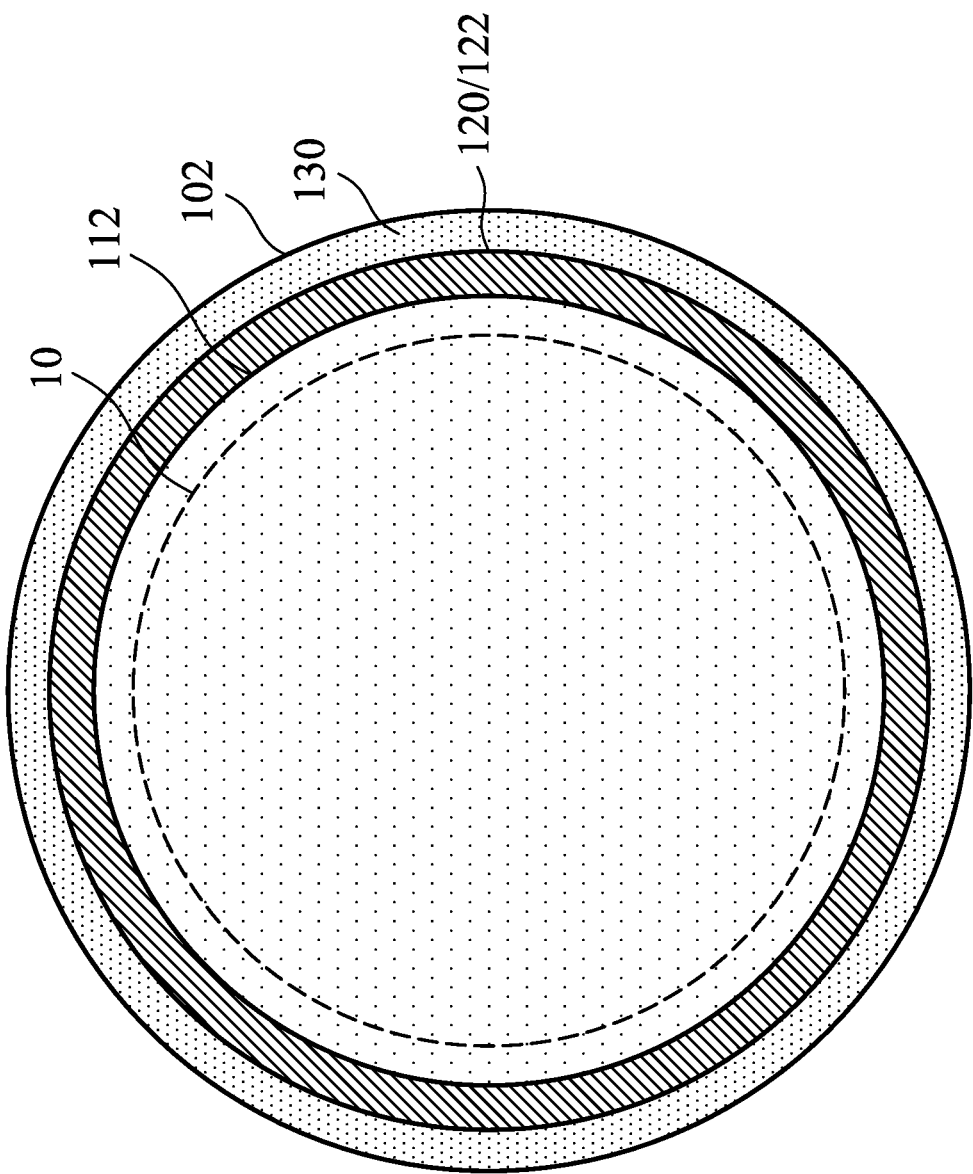
FIG. 1B illustrates a top view of a part of a dry etcher in accordance with some embodiments.
Figure 3:
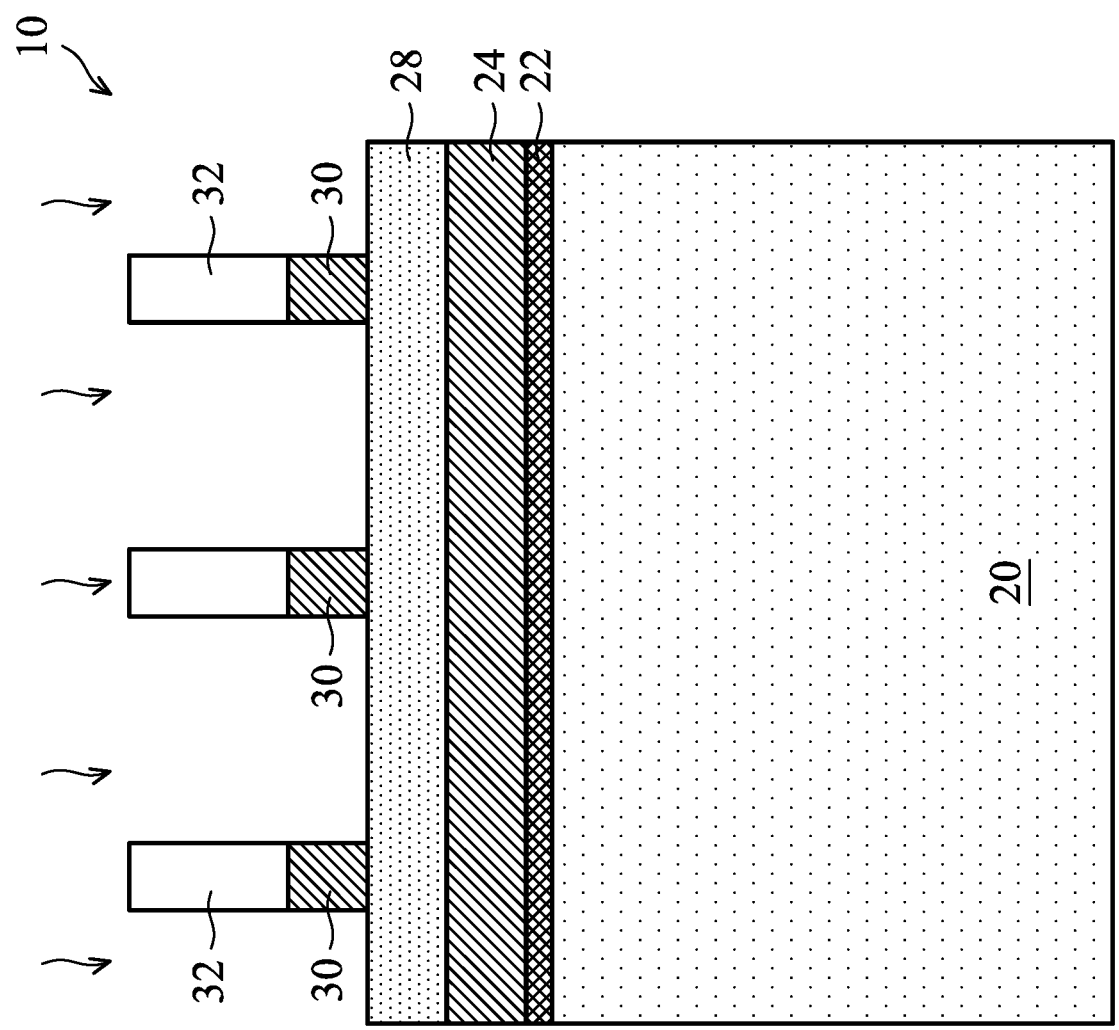
Figure 4:
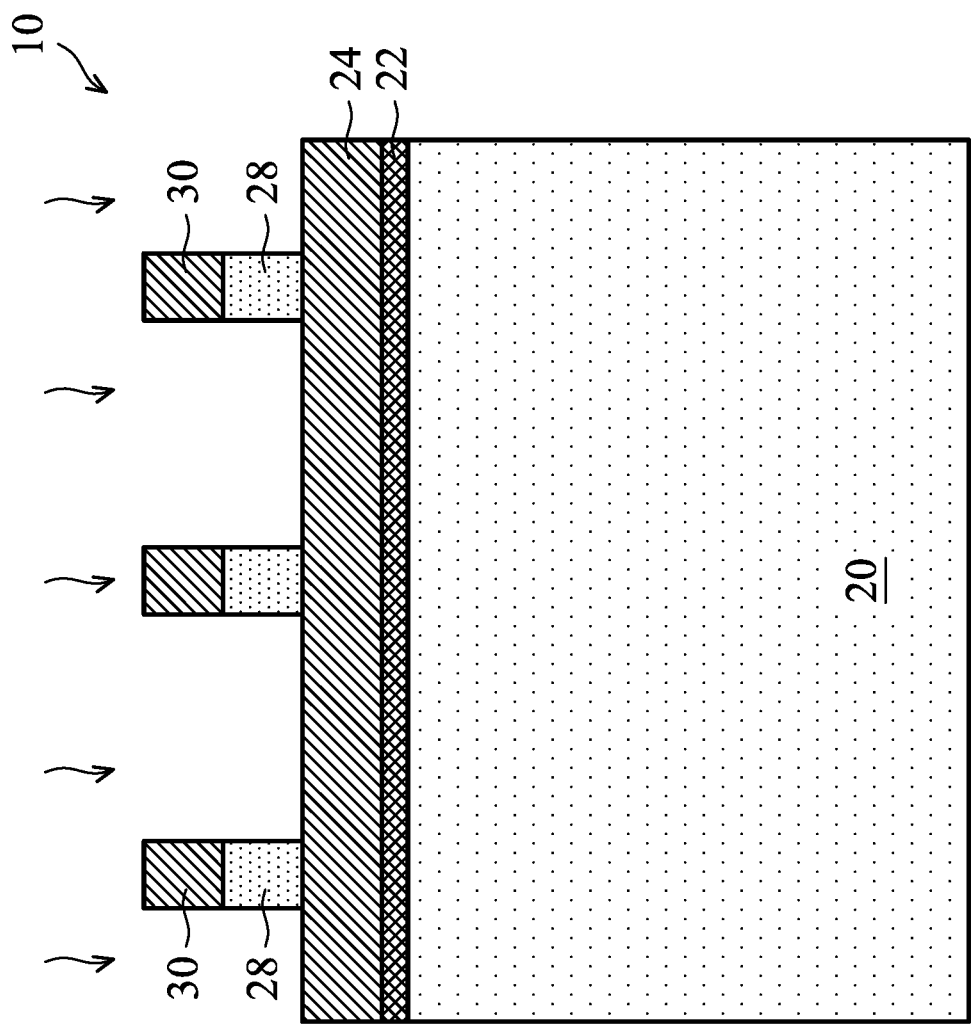
Figure 5:
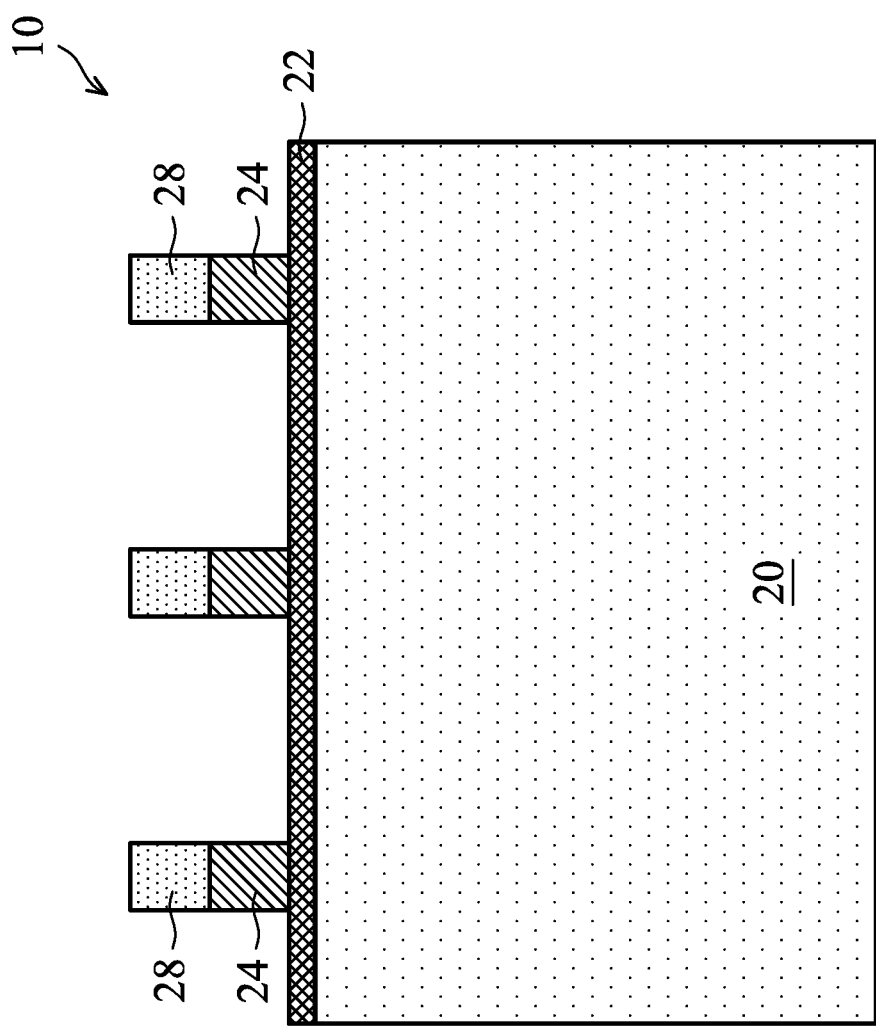

Next, hard mask layer 30, oxide layer 28, and hard mask layer 24 are etched, as shown in FIGS. 3 through 5. In accordance with some exemplary embodiments, the etching of layers 30, 28, and 24 are performed in a same dry etcher, which includes dry etcher 100 as shown in FIGS. 1A and 1B. In addition, the etching of layers 30, 28, and 24 may be performed without vacuum break therebetween in accordance with some embodiments. In accordance with alternative embodiments, there are vacuum breaks between the etching of layers 30, 28, and 24.

FIG. 1A schematically illustrates a cross-sectional view of a part of dry etcher 100 in accordance with some embodiments of the present disclosure. Dry etcher 100 includes etching chamber 102, which is a vacuum chamber. E-Chuck 103 is placed in chamber 102, and bottom conductive plate 104 may be further located under E-Chuck 103. Wafer 10, which is to be etched, is placed on, and is secured by, E-Chuck 103. Focus ring 108 is a ring in the top view of wafer 10, with wafer 10 being located in the region encircled by focus ring 108. In accordance with some embodiments of the present disclosure, focus ring 108 is formed of silicon, which is free from oxygen therein. Cover ring 110 is also a ring encircling focus ring 108. Cover ring 110 may be formed of quartz, which is silicon oxide, and has the chemical formula of $SiO_2$.

Over wafer 10 and E-Chuck 103 resides inner cell 112, which is directly over wafer 10. Inner cell 112 is alternatively referred to as top plate 112 throughout the description. Top plate 112 overlaps wafer 10, and may have an area at least equal to or larger than the underlying wafer 10. Top plate 112 may be a solid plate with no hole therein. Top plate 112 and wafer 10 define a space between them, wherein the process gas for etching wafer 10 fills the space. In addition, top plate 112 is the bottommost part that is directly over the space. Alternatively stated, in the etching of wafer 10, top plate 112 is exposed to, and is in physical contact with, the etchant gas and the plasma generated from the etchant gas. Top plated 112 may have a circular shape, as shown in FIG. 1B.

Over top plate 112 resides inner cooling plate 114. In accordance with some embodiments of the present disclosure, inner cooling plate 114 is formed of a material having a good thermal conductivity, which may be a metallic material formed of aluminum or an aluminum alloy in accordance with some embodiments. In accordance with some embodiments, inner cooling plate 114 is hollow, with conduits (not shown) formed inside to allow coolant such as cool air, water, oil, etc. to flow through, so that the heat conducted from top plate 112 may be conducted away. Inner cooling plate 114 may be in physical contact with top plate 112 in accordance with some embodiments. Inner cooling plate 114 may have a circular top view shape.

Upper insulator 116 is located over inner cooling plate 114. In accordance with some embodiments of the present disclosure, upper insulator 116 is used to create capacitive coupled plasma. Upper insulator 116 may be formed of $Al_2O_3$.

Electrical conductive plate 118 is disposed over upper insulator 116. In accordance with some embodiments of the present disclosure, electrical conductive plate 118 is formed of an electrical conductive material such as copper, iron, aluminum, nickel, or the alloys thereof. Voltages may be applied between electrical conductive plate 118 and bottom conductive plate 106, so that plasma may be generated.

The dry etcher 100 may further include protection ring 120 and outer cell 122, wherein each of the protection ring 120 and outer cell 122 forms a ring (when viewed in the top view of chamber 102) encircling top plate 112. Each of protection ring 120 and outer cell 122 may also have a surface exposed to the space in which the etchant gases and the corresponding plasma are located. Protection ring 120 and outer cell 122 may be discrete parts.

Outer cooling plate 124 is located over outer cell 122. In accordance with some embodiments of the present disclosure, outer cooling plate 124 forms a ring (in the top view of chamber 102) that encircles inner cooling plate 114. The material of outer cooling plate 124 may be similar to the material of inner cooling plate 114. For example, outer cooling plate 124 may be formed of aluminum or an aluminum alloy. Outer cooling plate 124 may also have inner conduits (not shown) for conducting coolant therein in order to carry heat away. Outer cooling plate 124 and inner cooling plate 114 may be separated from each other by separator 126, which may also form a ring in a top view, and may be formed of quartz in accordance with some embodiments.

In accordance with some embodiments of the present disclosure, top plate 112, outer cell 122, and protection ring 120 are formed of non-oxygen-containing materials. In addition, if any part in chamber 102 has a bottom surface exposed to the etchant gas, this part may be formed of, or at least coated with, non-oxygen-containing materials. Accordingly, all materials within the circle defined by the outer edge of protection ring 120 and exposed to the etchant gas and the corresponding plasma are to be formed of non-oxygen-containing materials. In accordance with alternative embodiments, top plate 112 is formed of non-oxygen-containing material, while outer cell 122 and protection ring 120 may be formed of oxygen-containing materials such as quartz.

In accordance with some embodiments of the present disclosure, the non-oxygen-containing material for forming top plate 112, outer cell 122, and protection ring 120 is silicon, which is free from oxygen therein. In accordance with some exemplary embodiments, the weight percent of silicon in non-oxygen-containing material is over 95 weight percent, over 99 percent, or more. In accordance with other embodiments, the non-oxygen-containing material is silicon carbide (SiC). Top plate 112, outer cell 122, and protection ring 120 may be formed of the same or different oxygen-containing materials. For example, top plate 112 may be formed of silicon, and outer cell 122 and protection ring 120 may be formed of SiC, or vice versa. With at least top plate 112, and possibly outer cell 122 and protection ring 120 being formed of non-oxygen-containing materials, the amount of oxygen released from these parts in the etching of wafer 10 is significantly reduced or eliminated, and the profile of the etched hard mask layer 24 is improved, as will be discussed in subsequent paragraphs.

In accordance with alternative embodiments, top plate 112, outer cell 122, and protection ring 120 are coated with a non-oxygen-containing material as surface portions, while the inner parts of these parts are formed of an oxygen-containing material such as quartz. For example, the non-oxygen-containing material may form a conformal coating on all surfaces of the oxygen-containing material. Alternatively, the non-oxygen-containing material forms a conformal coating on the surfaces (of the oxygen-containing material) that may be exposed the etchant gas, but not on the surfaces not exposed to the etchant gas.

FIG. 1A also illustrates coating 130 on various parts in etching chamber 102. For example, coating 130 may cover the parts that are on the outer side of, and encircle, protection ring 120. Coating 130 may be formed of Yttrium Fluoride ($YF_3$) in accordance with some embodiments. The parts covered with coating 130 may include shield plates, deposition plates, shutters, conical baffles, and/or the like, which parts are not illustrated. It is noted that although coating 130 is illustrated as directly contacting the sidewalls of chamber 102, coating 130 may be in physical contact with the sidewalls of chamber 102, or may be spaced apart from the sidewalls of chamber 102 by parts such as deposition plates, shutters, conical baffles, and/or the like.

FIG. 1B illustrates a top view of some parts in chamber 102 in accordance with some embodiments. The parts formed of the non-oxygen-containing material may have a top-view area greater than the top-view area of wafer 10, and hence extend beyond the edges of wafer 10. The top-view area of top plate 112 may be greater than the top view area of wafer 10, and protection ring 120 and outer cell 122 further extend outwardly from the edges of top plate 112, so that the top view area of the non-oxygen-containing material extends farther from the edges of wafer 10 in the top view. With the non-oxygen-containing material extending far away from the edges of wafer 10 in the top view, the amount of released oxygen during the etching is advantageously minimized.

Referring back to FIG. 2, nitride hard mask 32 is patterned in mandrel process. The respective step is illustrated as step 202 in the process flow shown in FIG. 12. Wafer 10 (including nitride hard mask 32) is then placed in chamber 102 as shown in FIGS. 1A and 1B, and hard mask layer 30 is etched. The respective step is illustrated as step 204 in the process flow shown in FIG. 12. FIG. 3 illustrates the resulting wafer 10. In accordance with some embodiments, the etching includes two stages. In the first stage, the etchant gas includes a fluorine-containing gas such as $CH_3F$. The etchant gas may also include $C_4F_6$, $CF_4$, $NF_3$, and/or $SF_6$. No oxygen ($O_2$) is added into the process gas in the first stage. In the second stage, the fluorine-containing gas is also used, and oxygen is added so that the etching is slowed down, and the edges of the resulting remaining portions of hard mask layer 30 is improved to be straighter and more vertical.

Next, as shown in FIG. 4, oxide layer 28 is etched. The respective step is illustrated as step 206 in the process flow shown in FIG. 12. Nitride hard mask 32 (FIG. 3) will be left when etching of oxide layer 28 in accordance with some embodiments, and will be consumed in subsequent etching processes. In accordance with some embodiments of the present disclosure, the etching is performed using $C_4F_6$ as an etchant gas. Other gases such as oxygen ($O_2$) and/or Ar may also be used.

In the etching of oxide layer 28, it is preferred that there is a high etching selectivity, which etching selectivity is the ratio of ERoxide/ERnitride, wherein ERoxide is the etching rate of oxide layer 28, and ERnitride is the etching rate of nitride layer 24. With the etching selectivity ERoxide/ERnitride being high, which means the etching rate of nitride layer 24 is low, the damage to nitride layer 24 is minimized after oxide layer 28 is etched through and nitride layer 24 is exposed. The etching rate of nitride layer 24 is affected by the percentage of oxygen in etching chamber 102 (FIG. 1A). The oxygen has two sources, including the oxygen provided as a part of the etchant gas, and the oxygen released from the parts in chamber 102. In the etching process, the amount of the oxygen released from the parts in chamber 102 cannot be controlled, and may cause the variation in the etching of oxide layer 28, and the control of the etching of oxide layer 28 is compromised, hence the damage of nitride layer 24.

In accordance with some embodiments of the present disclosure, to minimize the amount of the oxygen released from the parts in chamber 102, the parts in chamber 102 may be formed use the non-oxygen-containing materials such as silicon or silicon carbide. It is appreciated that the oxygen-containing parts in contact with high-energy plasma and/or high temperature gases/plasma are more likely to release oxygen. Accordingly, top plate 112, outer cell 122, and protection ring 120 are formed using non-oxygen-containing materials, while other parts not in contact with high-energy gases/plasma and/or high temperature gases/plasma may be formed of either non-oxygen-containing materials or oxygen-containing materials without affecting the etching process. Conventional dry etchers may have these pars formed of quartz, which comprises silicon oxide. Accordingly, these parts are removed from dry etcher 100, and are replaced with the parts that are formed of non-oxygen-containing materials. As a result, when oxide layer 28 (FIG. 4) is etched in chamber 102, the released oxygen amount is reduced.

After the etching of oxide layer 28 as shown in FIG. 4, hard mask layer 24 is etched, as shown in FIG. 5. The respective step is illustrated as step 208 in the process flow shown in FIG. 12. In accordance with some embodiments, the etching is performed using similar etchant gases as etching hard mask layer 30. The process conditions for etching layers 24 and 30 may also be similar. The etching may also be performed in chamber 102 as shown in FIG. 1A. Advantageously, since the damage to hard mask layer 24 is minimized in the etching of oxide layer 28, and there is no undercut occurring to hard mask layer 24, after the etching of hard mask layer 24 is finished, the resulting portions of hard mask layer 24 has straighter and more vertical sidewalls (compared to if top plate 112 (FIG. 1A) is formed of quartz). After the etching of hard mask layer 24, oxide layer 22 is exposed. The etching in chamber 102 is thus concluded, and wafer 10 may be removed out of chamber 102.

Since the etching of wafer 10 includes oxygen-containing gases, from which plasma is further generated, over time, top plate 112, outer cell 122, and protection ring 120 (FIG. 1A) will have oxide generated at their surfaces. For example, when top plate 112, outer cell 122, and protection ring 120 are formed silicon, silicon oxide layers will be generated. The silicon oxide layers will also release oxygen, and will adversely affect the etching of subsequently etched wafers. In accordance with some embodiments of the present disclosure, after the etching of certain numbers of wafers, top plate 112, outer cell 122, and protection ring 120 (FIG. 1A) may be taken out of chamber 102, and the oxide layers are removed, for example, in a wet etching process, so that non-oxygen-containing material of these parts is re-exposed. The cleaned parts are re-installed into chamber 102, and subsequent wafers are etched. The cleaning of top plate 112, outer cell 122, and protection ring 120 may be performed periodically. Focus ring 108 may also be cleaned periodically to remove oxide (if any) generated on its surface.

Figure 6:
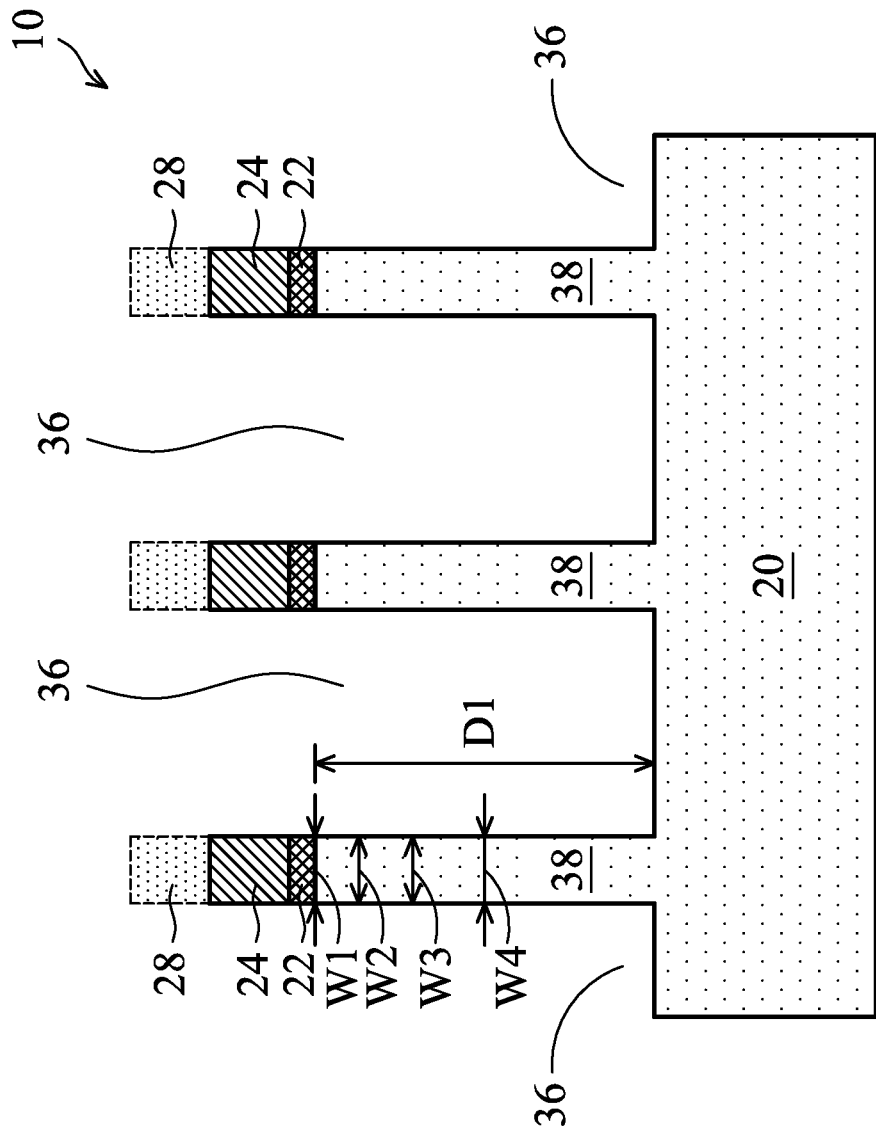

Referring to FIG. 6, hard mask layer 24 is used as an etching mask to etch pad oxide layer 22 and semiconductor substrate 20. The respective step is illustrated as step 210 in the process flow shown in FIG. 12. Trenches 36 are formed to extend into semiconductor substrate 20. The portions of semiconductor substrate 20 between neighboring trenches 36 are referred to as semiconductor strips 38 hereinafter. Trenches 36 may have the shape of strips (when viewed in the top view of wafer 10) that are parallel to each other, and trenches 36 are closely located from each other. Next, a cleaning step may be performed. The cleaning may be performed using diluted hydrofluoric (HF) acid, for example.

Advantageously, since the hard mask layer 24 as shown in FIG. 5 have straight and vertical sidewalls, and the straight and vertical sidewalls of the hard mask layer 24 will be transferred to the underlying etched semiconductor substrate 20, the resulting semiconductor strips 38 will have straight and vertical edges. For example, FIG. 6 illustrates widths W1, W2, W3, and W4 of semiconductor strips 38. Width W1 is the top width of semiconductor strips 38. Widths W2, W3, and W4 are measured at 10 percent, 30 percent, and 50 percent, respectively, of depth D1 of trenches 36. Experiment results indicated that each of ratios W2/W1, W3/W1, and W4/W1 is in the range between about 0.9 and about 1.2, indicating that the edges of semiconductor strips 38 are substantially straight and vertical. Experimental results performed on physical wafers also revealed that if top plate 112, outer cell 122, and protection ring 120 are formed of quartz, the edges of the corresponding semiconductor strips 38 are much more tilted that if these components are formed of silicon.

Figure 11:
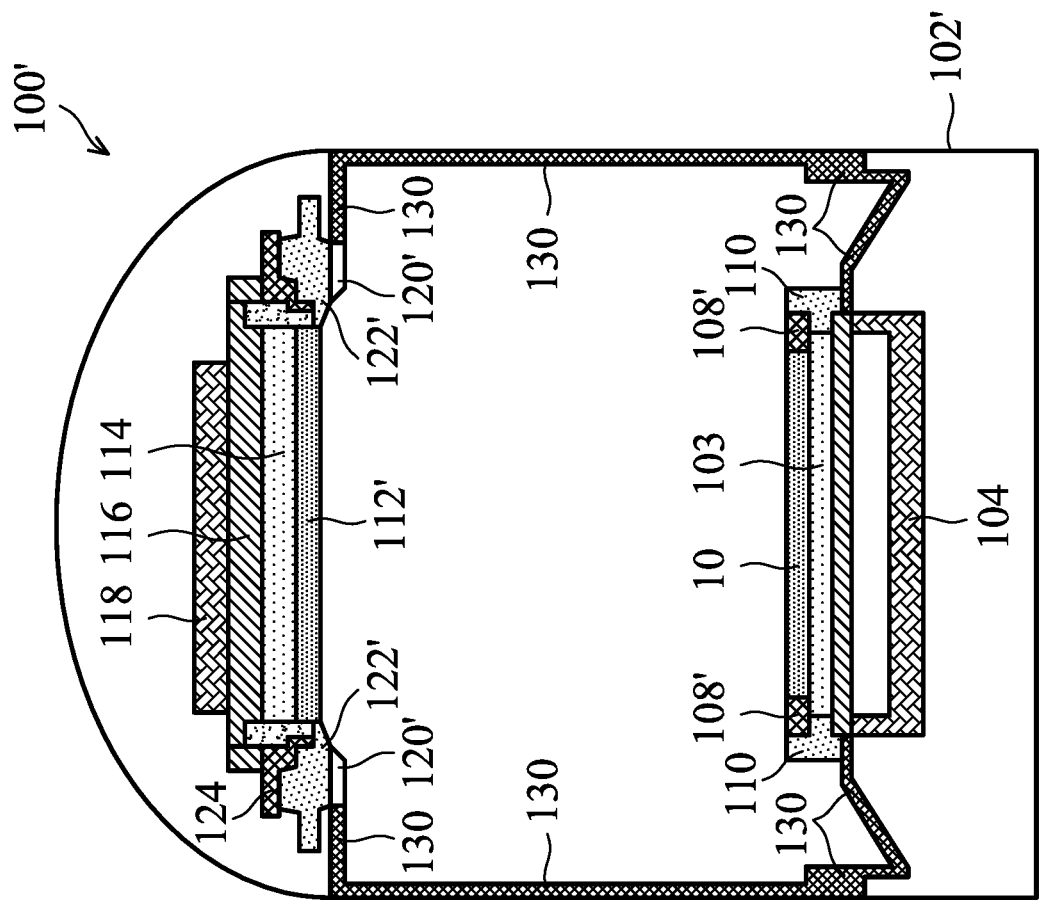
FIG. 11 illustrates a cross-sectional view of another dry etcher in accordance with some embodiments.

In accordance with some embodiments of the present disclosure, the etching of pad oxide layer 22 and semiconductor substrate 20 is performed in dry etcher 100', which is schematically illustrated in FIG. 11, in which wafer 10 is etched to form trenches 36 (FIG. 6). In accordance with some embodiments, dry etcher 100' and chamber 102' are essentially the same as dry etcher 100 and chamber 102 (FIG. 1A), respectively, except the materials of top plate 112', outer cell 122', and protection ring 120' (and possibly focus ring 108') are formed of an oxygen-containing material such as quartz rather than non-oxygen-containing materials. In accordance with alternative embodiments, dry etcher 100' and chamber 102' have different structures and designs than dry etcher 100 and chamber 102, respectively. However, the respective top plate 112', outer cell 122', and protection ring 120' (even if they may have different shapes, sizes, etc.) are formed of an oxygen-containing material such as quartz. Since quartz is a proven material suitable for etchers, when the respective processes are not sensitive to the released oxygen, quartz is preferred for its proven properties.

Figure 7:
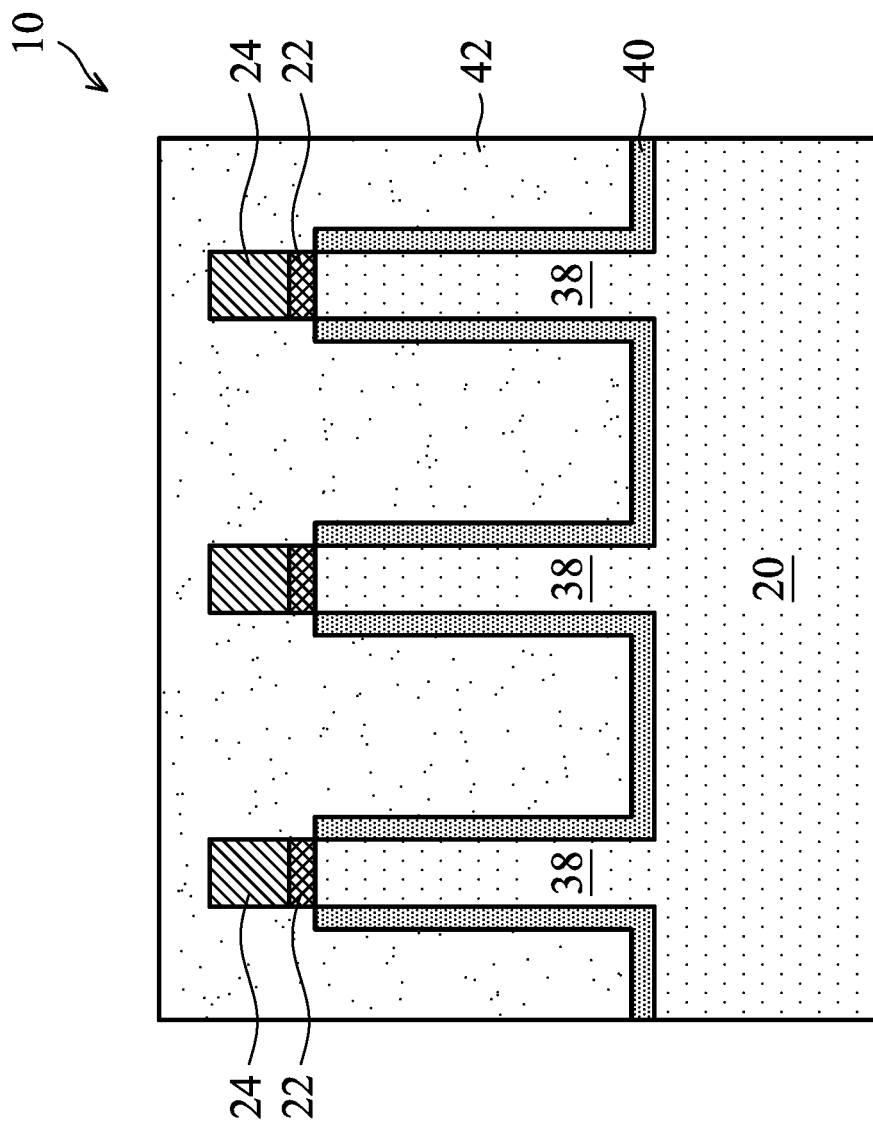

FIG. 7 illustrates the filling of dielectric materials. In accordance with some embodiments, liner oxide 40 is formed in trenches 36 (FIG. 6) and on the sidewalls of semiconductor strips 38. Liner oxide 40 may be a conformal layer whose horizontal portions and vertical portions have thicknesses close to each other. Liner oxide 40 may be a thermal oxide having a thickness between about 10 Å and about 100 Å in accordance with some exemplary embodiments. Liner oxide 40 may be formed by oxidizing wafer 10 in an oxygen-containing environment, for example, through Local Oxidation of Silicon (LOCOS), wherein oxygen ($O_2$) may be included in the respective process gas. In accordance with other embodiments of the present disclosure, liner oxide 40 is formed using In-Situ Steam Generation (ISSG), for example, with water steam or a combined gas of hydrogen ($H_2$) and oxygen ($O_2$) used to oxidize semiconductor strips 38. In accordance with yet other embodiments, liner oxide 40 is formed using a deposition technique such as Sub Atmospheric Chemical Vapor Deposition (SACVD).

FIG. 7 also illustrates the deposition/formation of dielectric material 42. Dielectric material 42 fills trenches 36 as shown in FIG. 6. The formation method of dielectric material 42 may be selected from Flowable Chemical Vapor Deposition (FCVD), Chemical Vapor Deposition (CVD), Atomic Layer Deposition (ALD), and the like. A treatment may be performed to cure dielectric material 42. The resulting dielectric material 42 may include silicon oxide, for example.

Figure 8:
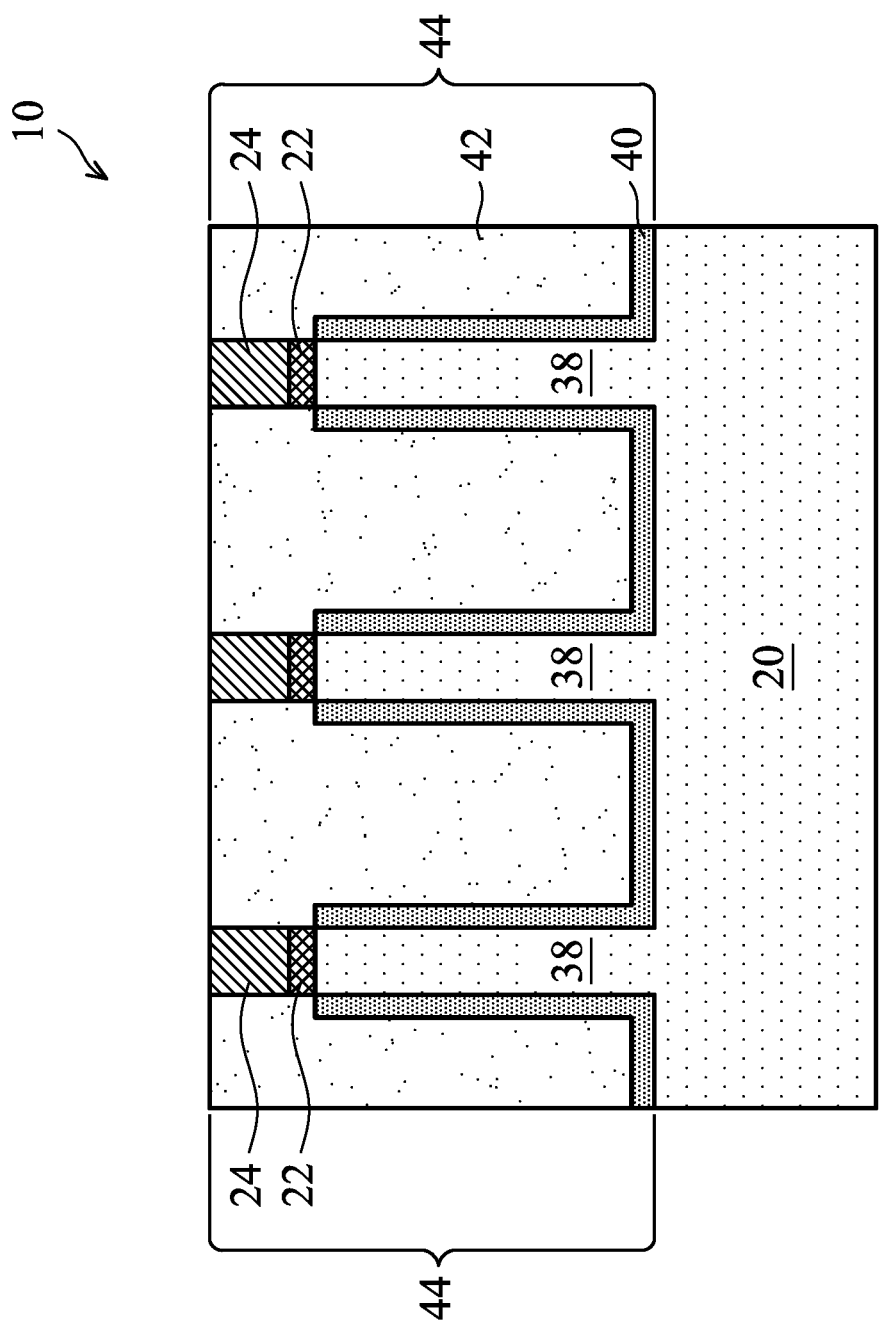

A planarization such as a Chemical Mechanical Polish (CMP) is then performed, as shown in FIG. 8. STI regions 44 are thus formed, which include the remaining portions of liner oxide 40 and dielectric material 42. Hard mask layer 24 may be used as the CMP stop layer, and hence the top surface of hard mask layer 24 is substantially level with the top surface of STI regions 44. The steps shown in FIGS. 7 and 8 are illustrated as step 212 in the process flow shown in FIG. 12.

Figure 9:
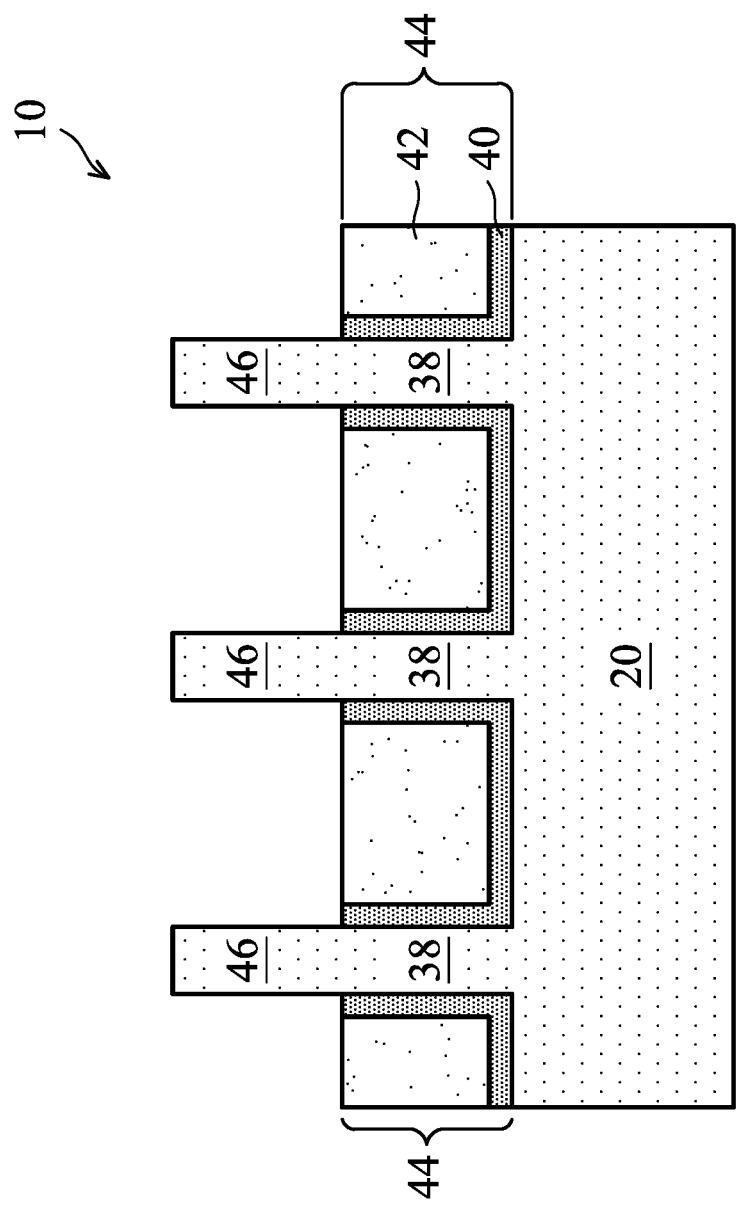

In subsequent process steps, hard mask layer 24 and pad oxide layer 22 are removed. Next, STI regions 44 are recessed. The respective step is illustrated as step 214 in the process flow shown in FIG. 12. The top portions of semiconductor strips 38 protrude higher than the top surfaces of remaining STI regions 44 to form protruding fins 46. The resulting structure is shown in FIG. 9. In accordance with some embodiments of the present disclosure, the recessing of STI regions 44 is performed using a dry etch method, in which the process gases including $NH_3$ and $HF_3$ are used. In accordance with alternative embodiments of the present disclosure, the recessing of STI regions 44 is performed using a wet etch method, in which the etchant solution is a dilution HF solution.

Figure 10:
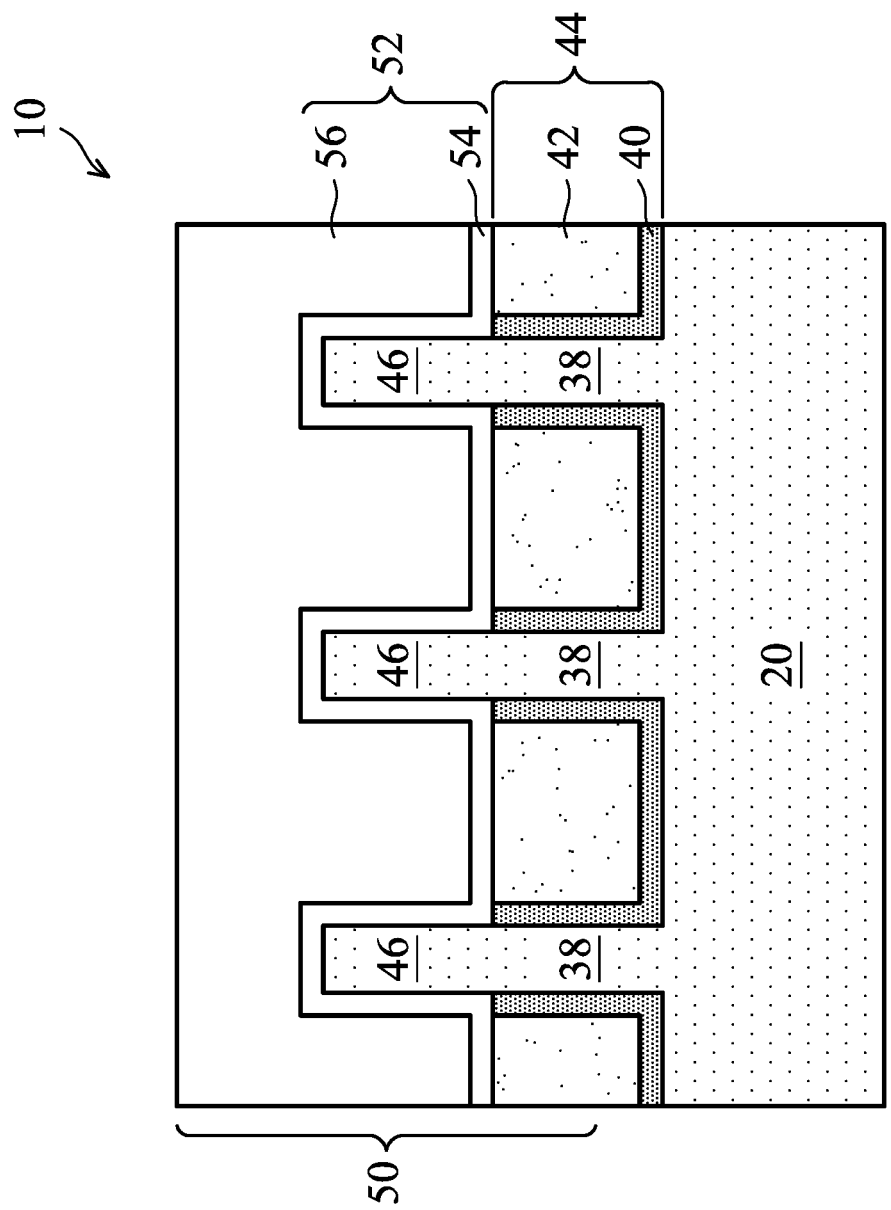

After STI regions 44 are recessed to form semiconductor fins 46, a plurality of process steps is performed on semiconductor fins 46, which process steps may include well implantations, gate stack formation, source/drain formation, replacement gate formation, and source/drain contact plug formation. FinFETs are thus formed. The respective step is illustrated as step 216 in the process flow shown in FIG. 12. An exemplary FinFET 50 is illustrated in FIG. 10, wherein the illustrated gate stack 52 includes gate dielectric 54 on the top surfaces and sidewalls of fins 46, and gate electrode 56 over gate dielectric 54. Gate dielectric 54 may be formed through a thermal oxidation process, and hence may include thermal silicon oxide. The formation of gate dielectric 54 may also include a deposition step, and the resulting gate dielectric 54 may include a high-k dielectric material. Gate electrode 56 is then formed on gate dielectric 54. The formation processes of these components are not discussed in detail. Gate dielectric 54 and gate electrode 56 may be formed using a gate-first approach or a gate last approach. The remaining components of FinFET 50, which include source and drain regions and source and drain silicide regions (not in the illustrated plane), are also formed.

The embodiments of the present disclosure have some advantageous features. By replacing the commonly used quartz parts in the dry etcher with the parts formed of non-oxygen containing parts, the silicon nitride mask layer etched in the dry etcher has straighter and more vertical edges than the silicon nitride mask layer etched in other dry etchers having quartz top plates. The semiconductor strips formed using the silicon nitride mask layer as an etching mask are thus straighter and more vertical.

In accordance with some embodiments of the present disclosure, a method includes etching a first oxide layer in a wafer. The etching is performed in an etcher having a top plate overlapping the wafer, and the top plate is formed of a non-oxygen-containing material. The method further includes etching a nitride layer underlying the first oxide layer in the etcher until a top surface of a second oxide layer underlying the nitride layer is exposed. The wafer is then removed from the etcher, with the top surface of the second oxide layer exposed when the wafer is removed.

In accordance with some embodiments of the present disclosure, a method includes placing a wafer into a first etching chamber. The first etching chamber has a first top plate overlapping the wafer, and the first top plate is formed of a non-oxygen-containing material. A first oxide layer of the wafer is etched in the first etching chamber to expose a first nitride layer underlying the first oxide layer. The first nitride layer is further etched in the first etching chamber to expose a second oxide layer. In the etching of the first oxide layer and the first nitride layer, the first top plate is exposed to the plasma generated from respective etchant gases. The method further includes removing the wafer out of the first etching chamber, etching the second oxide layer in a second etching chamber to expose a semiconductor substrate, etching the semiconductor substrate to form a trench, and filling the trench with a dielectric material to form a shallow trench isolation region.

In accordance with some embodiments of the present disclosure, a method includes placing a wafer on an E-chuck of an etching chamber, wherein the wafer is directly underlying a plurality of parts in the etching chamber, with a space located between the plurality of parts and the wafer. The plurality of parts is formed of silicon. A silicon oxide layer in the wafer is etched using an etchant gas, with plasma generated in the space when the silicon oxide layer is etched. Bottom surfaces of the plurality of parts are exposed to the plasma. In the etching the silicon oxide layer, oxygen ($O_2$) is conducted as a part of the etchant gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
placing a wafer underlying a first top plate in a first etcher, wherein the first top plate is formed of a non-oxygen-containing material;
etching a target layer on the wafer in the first etcher, wherein the etching the target layer comprises etching a first nitride layer in the wafer to form a patterned first nitride layer, wherein a first oxide layer underlying the first nitride layer is exposed after the first nitride layer is etched, and wherein the etching the first nitride layer comprises:
a first stage performed using a first etching gas free from oxygen; and
a second stage performed using a second etching gas comprising oxygen ($O_2$);
etching the first oxide layer using the patterned first nitride layer as an etching mask;
etching a second nitride layer underlying the first oxide layer until a top surface of a second oxide layer underlying the second nitride layer is exposed, wherein the first nitride layer and the second nitride layer have a same pattern after both are etched;
removing the wafer from the first etcher;
taking the first top plate out of the first etcher;
removing a surface oxide layer on the first top plate to expose the non-oxygen-containing material; and
re-installing the first top plate back into the first etcher.

2. The method of claim 1, wherein the first top plate comprises silicon, and the surface oxide layer comprises silicon oxide formed during the etching the target layer.

3. The method of claim 1 further comprising etching the second oxide layer in a second etcher, wherein the second etcher has a second top plate formed of an oxygen-containing material.

4. The method of claim 3, wherein the first etcher and the second etcher have identical designs except materials directly over the wafer are different between the first etcher and the second etcher.

5. The method of claim 3, wherein the second top plate comprises quartz.

6. The method of claim 1, wherein when the first top plate is re-installed back into the first etcher, the non-oxygen-containing material is exposed.

7. The method of claim 1 further comprising:
taking a protection ring circling the first top plate out of the first etcher;
removing an additional surface oxide layer formed on the protection ring; and
re-installing the protection ring back into the first etcher.

8. A method comprising:
placing a wafer into a first etching chamber, wherein the first etching chamber comprises a first protection ring over the wafer, and the first protection ring encircles a first region directly over the wafer, and the first protection ring comprises a non-oxide material, and wherein the wafer comprises:
a semiconductor substrate;
a first oxide layer over the semiconductor substrate;
a nitride layer over and contacting the first oxide layer;
a second oxide layer over and contacting the nitride layer;
performing an etching process in the first etching chamber to etch the second oxide layer, with a plasma generated in the etching process, wherein the first protection ring is exposed to the plasma during the etching process, and a surface portion of the first protection ring is oxidized to generate an oxide-coating layer;
etching the nitride layer to reveal the first oxide layer;
etching the first oxide layer in a second etching chamber, wherein the second etching chamber comprises a second protection ring over the wafer, and the second protection ring encircles a second region directly over the wafer, and the second protection ring is formed of an oxygen-containing material; and
etching the semiconductor substrate in the second etching chamber.

9. The method of claim 8 further comprising removing the oxide-coating layer, wherein the oxide-coating layer is removed outside of the first etching chamber.

10. The method of claim 9 further comprising:
taking the first protection ring outside of the first etching chamber to etch the oxide-coating layer; and
re-stalling the first protection ring back into the first etching chamber.

11. The method of claim 8, wherein the first protection ring comprises silicon, and the oxide-coating layer comprises a silicon oxide layer.

12. The method of claim 8, wherein the first protection ring forms a full ring encircling a top plate, and wherein the method further comprises etching an additional oxide layer on the top plate.

13. The method of claim 8, wherein the first etching chamber and the second etching chamber have a same design except material differences between the first protection ring and the second protection, and material differences between top plates and outer cells in the first etching chamber and the second etching chamber.

14. A method comprising:
placing a wafer into an etching chamber of a first etcher, wherein a first top plate, a first outer cell, and a first protection ring of the first etcher are formed of a non-oxygen-containing material, and wherein the first top plate is directly above the wafer, the first protection ring encircles the first top plate, and the first outer cell is directly underlying the first protection ring;
etching a first silicon oxide layer in the wafer using an etchant gas, wherein the first silicon oxide layer is etched in the first etcher, with plasma being generated in the first etcher, and wherein in the etching the first silicon oxide layer, oxygen is conducted as a part of a corresponding etchant gas;
etching a nitride layer underlying the first silicon oxide layer in the etching chamber of the first etcher until a top surface of a second oxide layer underlying the nitride layer is exposed; and
etching the second oxide layer underlying the nitride layer in a second etcher, wherein the first etcher and the second etcher have a same design, with a second top plate, a second outer cell, and a second protection ring in the second etcher being formed of an oxygen-containing material, and wherein the second top plate is directly above the wafer, the second protection ring encircles the second top plate, and the second outer cell is directly underlying the second protection ring.

15. The method of claim 14 further comprising:
removing the first top plate out of the etching chamber;
etching an additional silicon oxide layer generated on the first top plate to reveal the first top plate; and
re-installing the first top plate back into the etching chamber.

16. The method of claim 14 further comprising:
removing the first outer cell out of the etching chamber;
etching an additional silicon oxide layer generated on the first outer cell to reveal the first outer cell; and
re-installing the first outer cell back into the etching chamber.

17. The method of claim 14 further comprising:
removing the first protection ring out of the etching chamber;
etching an additional silicon oxide layer generated on the first protection ring to reveal the first protection ring; and
re-installing the first protection ring back into the etching chamber.

18. The method of claim 14, wherein the first top plate is formed of silicon, and the method further comprises cleaning the first top plate to re-expose the silicon.

19. The method of claim 14, wherein the first protection ring is formed of silicon, and the method further comprises cleaning the first protection ring to re-expose the silicon.

* * * * *